United States Patent [19]
Yang

[11] Patent Number: 5,811,324
[45] Date of Patent: Sep. 22, 1998

[54] METHOD FOR MANUFACTURING THIN FILM TRANSISTOR

[75] Inventor: Hae Chang Yang, Chungcheongbuk-do, Rep. of Korea

[73] Assignee: LG Semicon Co., Ltd., Chungcheongbuk-Do, Rep. of Korea

[21] Appl. No.: 808,166

[22] Filed: Feb. 28, 1997

Related U.S. Application Data

[62] Division of Ser. No. 634,037, Apr. 17, 1996, Pat. No. 5,637,884.

[30] Foreign Application Priority Data

Dec. 26, 1995 [KR] Rep. of Korea .......................... 56315

[51] Int. Cl.$^6$ .......................... H01L 21/84; H01L 21/336
[52] U.S. Cl. .......................... 438/159; 438/286; 438/302
[58] Field of Search .......................... 437/21, 40–41, 437/909, 186; 438/151, 158, 286, 525, 302, 159

[56] References Cited

U.S. PATENT DOCUMENTS

| | | | |
|---|---|---|---|
| 5,095,347 | 3/1992 | Kirsch | 357/23.7 |
| 5,120,666 | 6/1992 | Gotou | 437/40 |
| 5,410,172 | 4/1995 | Koizumi et al. | 257/347 |
| 5,420,055 | 5/1995 | Vu et al. | 437/40 |
| 5,578,513 | 11/1996 | Maegawa | 437/40 |
| 5,580,802 | 12/1996 | Mayer et al. | 437/40 |

FOREIGN PATENT DOCUMENTS

| | | | |
|---|---|---|---|
| 57-211779 | 12/1982 | Japan | 257/69 |
| 4-114437A | 4/1992 | Japan . | |

OTHER PUBLICATIONS

S. Maegawa et al., "A 0.4 m Gate–All–Around TFT(GAT) Using a Dummy Nitride Pattern for High Density Memories", Extended Abstracts of the 1994 International Conference on Solid State Devices and Materials, pp. 907–909 (1994).

K. Hamada et al., "Improvement of Poly–Si TFT Characteristics by Hydrogenation at $SiO_2$/Poly–Si Interfaces, Characterized by TDS Measurement of Deuterium Terminated Poly–Si", Extended Abstracts of the 1994 International Conference on Solid State Devices and Materials, pp. 470–472 (1994).

*Primary Examiner*—John Niebling
*Assistant Examiner*—Richard A. Booth
*Attorney, Agent, or Firm*—Morgan, Lewis & Bockius LLP

[57] ABSTRACT

A thin film transistor includes a first active layer formed on a substrate; a gate electrode formed on a center portion of the first active layer and having a lower side connected to the center portion of the first active layer; a second active layer electrically connected to the first active layer and formed on lateral sides and on an upper side of the gate electrode; and impurity regions formed at opposing lateral sides of the gate electrode. A method of manufacturing a thin film transistor includes the steps of forming a patterned layer on a substrate; forming a gate electrode which crosses the patterned layer; removing the patterned layer; forming a gate insulating film on a surface of the gate electrode including a portion of the gate electrode from which the patterned layer has been removed; forming an active layer which crosses the portion of the gate electrode from which the patterned layer has been removed and an upper portion of the gate electrode; and forming impurity regions at opposing lateral sides of the gate electrode.

9 Claims, 7 Drawing Sheets

METHOD FOR MANUFACTURING THIN FILM TRANSISTOR

This application is a division of application Ser. No. 08/634,037, filed on Apr. 17, 1996, now issued as U.S. Pat. No. 5,637,884.

BACKGROUND OF THE INVENTION

The present invention relates to a thin film transistor and a related method for manufacturing the same. More particularly, the present invention relates to a thin film transistor and related manufacturing method, in which an on-current is increased to thereby improve the value of an on/off current ratio.

In general, a thin film transistor may be used instead of a load resistor in a 1MB SRAM or higher device. A thin film transistor is also widely used as a switching element for switching an image data signal of each pixel region in a liquid crystal display device.

In the thin film transistor used in the various fields described above, to improve the consumption power of the SRAM cell and, more particularly, to diminish the consumption of power during a stand-by status and to simultaneously improve memory characteristics, an off-current of the thin film transistor is preferably decreased and an on-current thereof is preferably increased to enlarge the value of the on/off current ratio. To accomplish this purpose, the present inventor has suggested a thin film transistor such as that disclosed in U.S. Pat. No. 5,432,102.

As shown in FIG. 1 of this disclosure, in the above thin film transistor, a gate electrode 12 covered with a gate cap insulating film 13 is formed on an insulating substrate 11. An insulating side wall 16 is formed on one side of gate electrode 12 and cap gate insulating film 13.

A gate insulating film 14 and a semiconductor layer 15 are sequentially formed on substrate 11, gate electrode 12, and cap gate insulating film 13. A channel region C is formed adjacent to the side of gate electrode 12 opposite insulating side wall 16.

Further, associated with semiconductor layer 15, which is connected to the upper portion of channel region C and simultaneously adjacent to insulating film 14 located on gate cap insulating film 13, there are formed an off-set region and an LDD region having a low concentration impurity layer. Drain and source regions are formed on both sides of the channel region, the off-set region, and the LDD region.

According to the above thin film transistor, the off-current is decreased due to the off-set region connected in extended fashion to channel region C and the LDD region of the low concentration layer, thereby increasing the value of the on/off current ratio. However, since there is only one channel in which the on-current flows in the above thin film transistor, the value of the on-current cannot be increased to a great extent. Due to this, the amount that the value of the on/off current ratio can be increased is limited.

SUMMARY OF THE INVENTION

In order to solve the aforementioned problems, it is an object of the present invention to provide a thin film transistor and a method for manufacturing the same, in which a channel is formed with a double-layer structure to increase the on-current, thereby enlarging the value of the on/off current ratio. Additional objects and advantages of the invention will be set forth in the description which follows or will be obvious from the description or may be learned by practice of the invention.

According to one aspect of the present invention, to accomplish the above objects, a thin film transistor comprises a first active layer formed on a substrate; a gate electrode formed on a center portion of the first active layer and having a lower side connected to the center portion of the first active layer; a second active layer electrically connected to the first active layer and formed on lateral sides and on an upper side of the gate electrode; and impurity regions formed at opposing lateral sides of the gate electrode.

According to another aspect of the present invention, to accomplish the above objects, a method of manufacturing a thin film transistor comprises the steps of forming a patterned layer on a substrate; forming a gate electrode which crosses the patterned layer; removing the patterned layer; forming a gate insulating film on a surface of the gate electrode including a portion of the gate electrode from which the patterned layer has been removed; forming an active layer which crosses the lower portion of the gate electrode from which the patterned layer has been removed and an upper portion of the gate electrode; and forming impurity regions at opposing lateral sides of the gate electrode.

It is to be understood that both the foregoing general description and the following detailed description are exemplary only and should not be considered as being restrictive of the invention as claimed.

DETAILED DESCRIPTION OF THE INVENTION

An embodiment of the present invention will hereinafter be described with the reference to the attached drawings.

Figure 1:
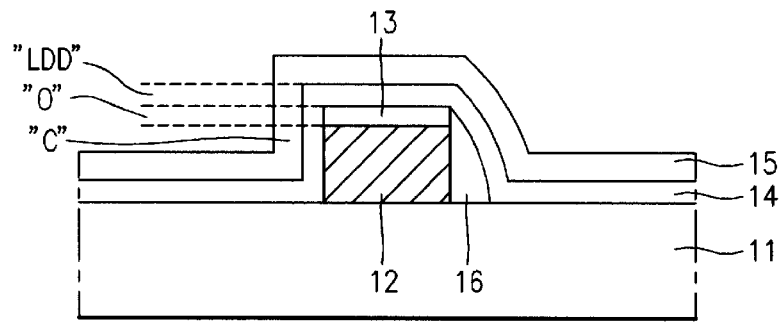
FIG. 1 is a cross-sectional view of a conventional thin film transistor.
Figure 2A:
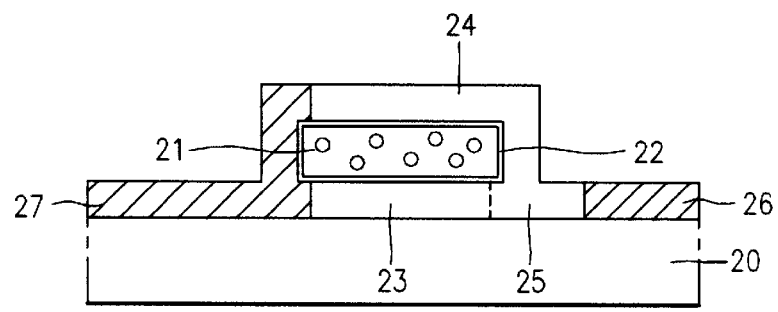
FIGS. 2A and 2B are a cross-sectional view and a perspective side view, respectively, of a thin film transistor according to the present invention.
Figure 2B:
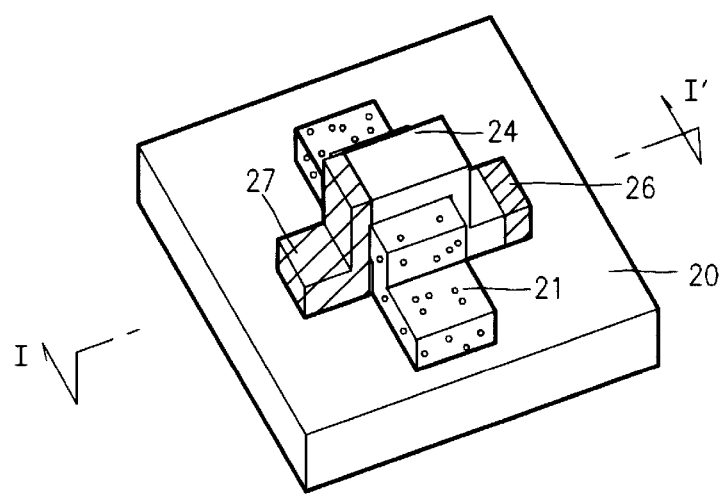

FIG. 2B is a schematic perspective side view of a thin film transistor according to the present invention. FIG. 2A is a cross-sectional view taken along line AA' in FIG. 2B.

As shown in FIG. 2A and FIG. 2B, the thin film transistor of the present invention is comprised of a gate electrode 21 including a polysilicon formed on an insulating substrate 20, a gate oxide film 22 deposited along the surface of gate electrode 21, a first channel semiconductor region 23 formed by depositing a P-type body polysilicon on a space formed under the center part of gate electrode 21 and between insulating substrate 20 and gate oxide film 22, and a second channel semiconductor region 24 formed by depositing a P-type body polysilicon over gate oxide film 22 and gate electrode 21.

One end of first channel semiconductor region 23 and one end of second channel semiconductor region 24 are connected with each other, and are also connected with a drain region 26 through an off-set region 25. Source region 27 extends from the other end of second channel semiconductor region 24 and is formed along the other side of gate electrode 21 on which gate oxide film 22 is deposited, thereby connecting with first channel semiconductor region 23.

A method for manufacturing th thin film transistor having the aforementioned structure according to the present invention will now be described with reference to the attached drawings.

FIGS. 3A through 3G are perspective side views for each manufacturing process of the thin film transistor according to the present invention. FIGS. 4A through 4G are cross-sectional views taken along line AA' in FIGS. 3A through 3G, respectively.

Figure 3A:
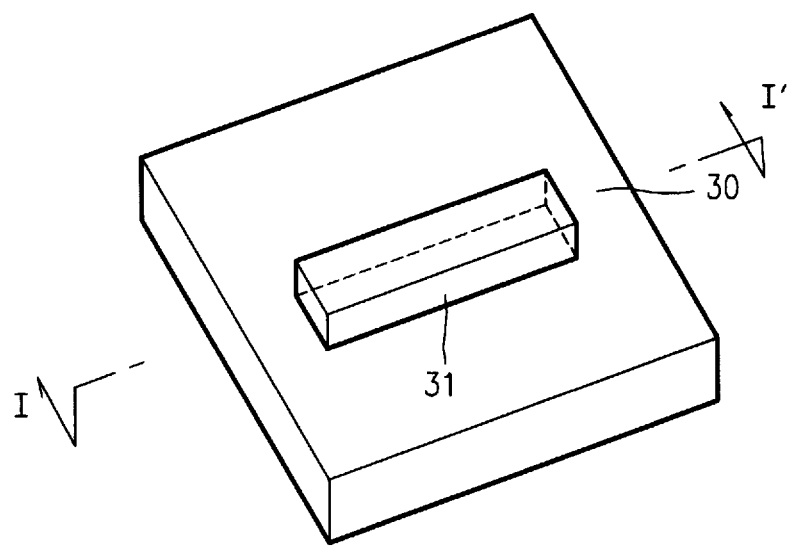
FIGS. 3A through 3G are perspective side views for various manufacturing processes of a thin film transistor according to the present invention.
Figure 4A:
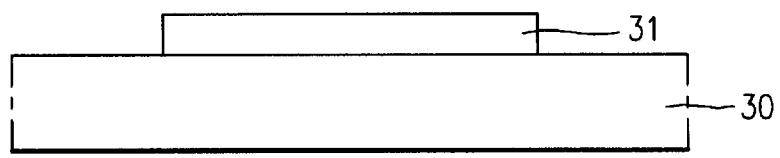
FIGS. 4A through 4G are cross-sectional views taken along line AA' in the respective perspective side views of FIGS. 3A to 3G, respectively.

As shown in FIG. 3A and FIG. 4A, after deposition of a silicon nitride film 31 on an insulating substrate 30, the silicon nitride film is patterned as a structure having a quadrilateral section, through a photolithography and etching process.

Figure 3B:
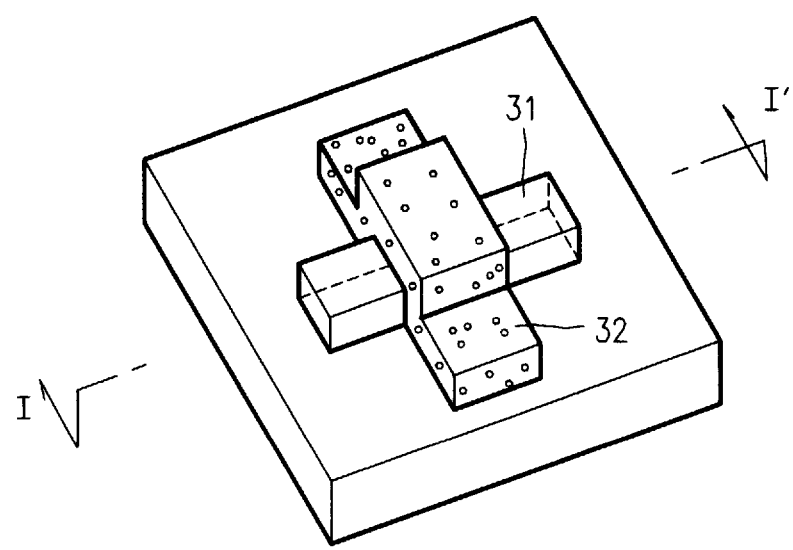
Figure 4B:
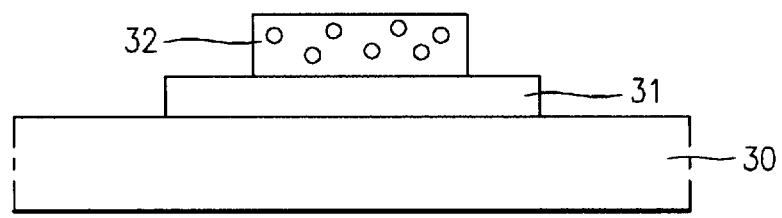

As shown in FIG. 3B and FIG. 4B, a polysilicon is deposited on insulating substrate 30 and the patterned silicon nitride film 31. The polysilicon is then patterned through a general photolithography and etching process, thereby forming a gate electrode 32.

Figure 3C:
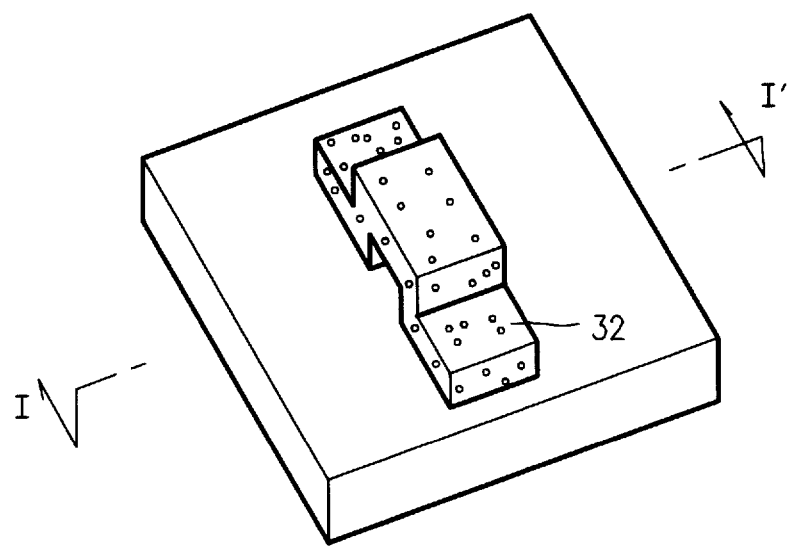
Figure 4C:
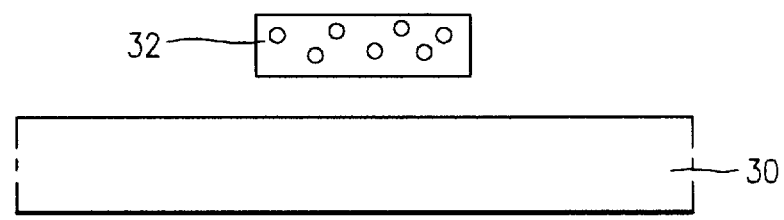

As shown in FIG. 3C and FIG. 4C, silicon nitride film 31 under the patterned gate electrode 32 is completely removed through the general wet etching process. As a result, there is obtained a gate electrode 32 having a mid-section thereof spaced apart from substrate 30 and protruding so as to form a penetrated space region therebeneath. A pair of side parts of gate electrode 32 are deposited by extending a conductive layer of a predetermined height on the insulating substrate at both sides of the penetrated space region under the gate electrode.

Figure 3D:
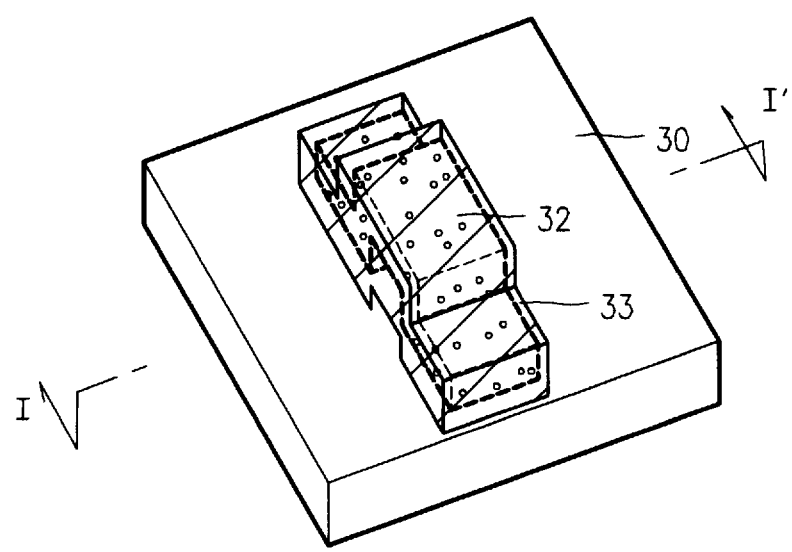
Figure 4D:
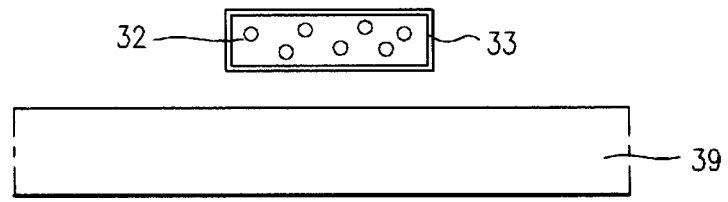

As shown in FIG. 3D and FIG. 4D, a gate oxide film 33 is deposited on the exposed surface including the inner surface of the penetrated space of gate electrode 32.

Figure 3E:
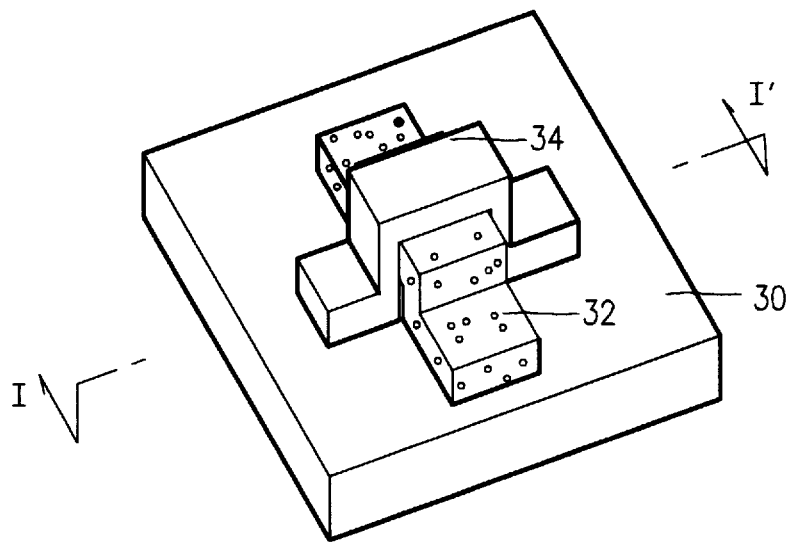
Figure 4E:
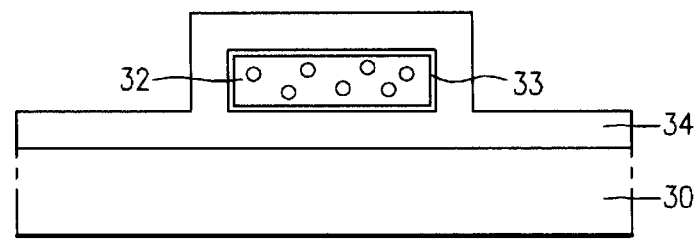

As shown in FIG. 3E and FIG. 4E, a P-type body polysilicon 34 is deposited on gate oxide film 33 formed on gate electrode 32. After patterning the body polysilicon 34 by using a photolithography and etching process, gate oxide film 33 deposited on the surface of gate electrode 32 is removed by using the patterned polysilicon layer 34 as a mask.

Figure 3F:
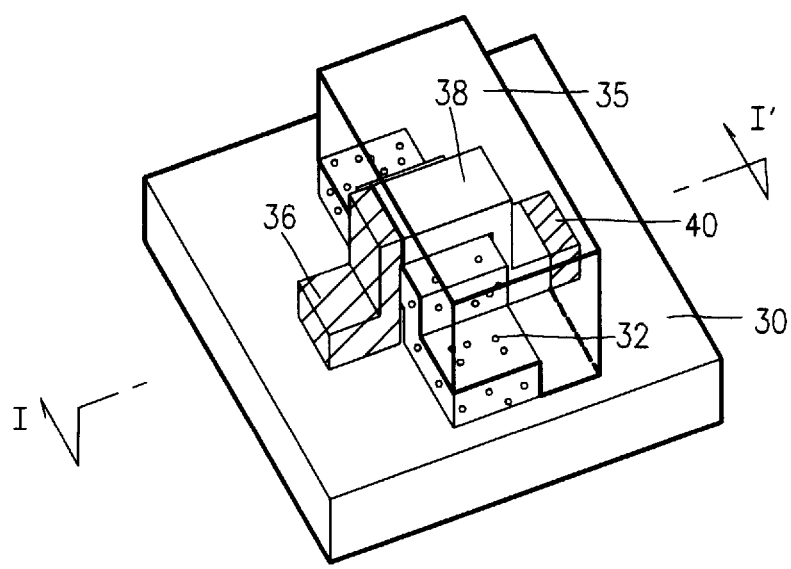
Figure 4F:
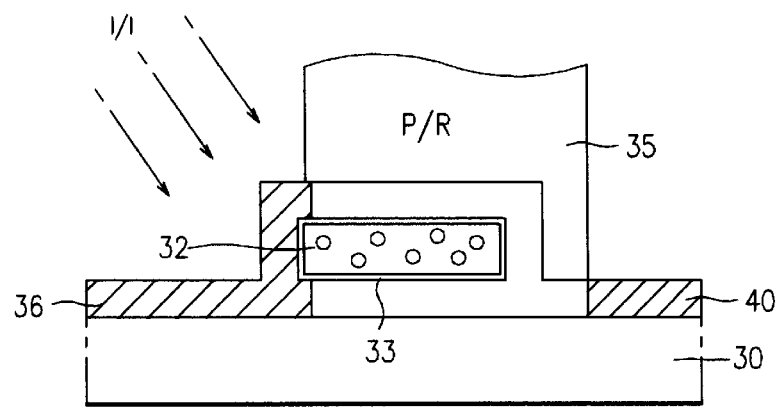

As shown in FIG. 3F and FIG. 4F, using a patterned photoresist 35 as a mask, a source region 36, a first channel region 38 located on gate electrode 32, a second channel region 37 located below gate electrode 32, an off-set region 39, and a drain region 40 are formed through a tilted ion implantation process.

Figure 3G:
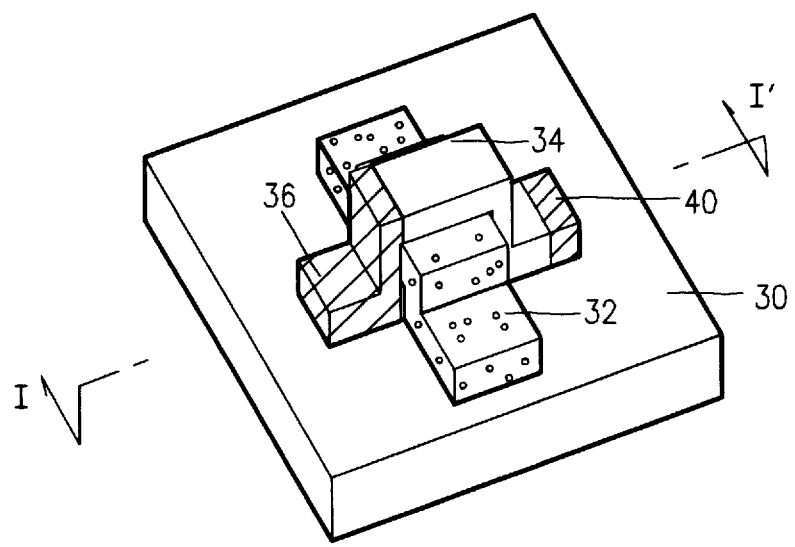
Figure 4G:
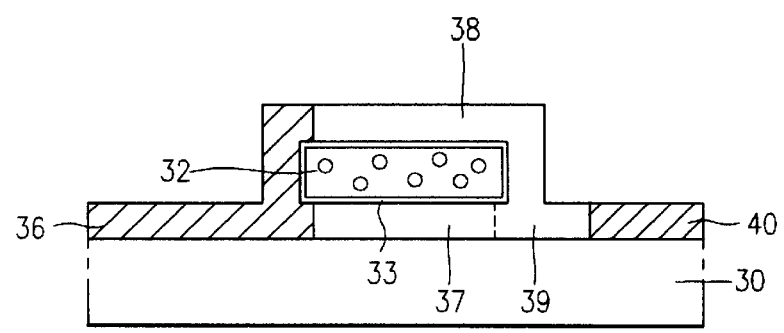

As shown in FIG. 3G and FIG. 4G, photoresist 35 is removed to thereby manufacture a P-type MOSFET having a double-layered channel structure with channel regions above and below gate electrode 32, respectively.

According to the P-type MOSFET of the present invention described above, when the P-type MOSFET is turned on, due to first channel region 37 whose current path is formed below gate electrode 32 and second channel region 38 formed above gate electrode 32, the on-current is increased as compared to that of a conventional single-channel MOSFET. When the P-type MOSFET is turned off, the off-current is a leakage current caused by the electric field between the source and drain regions and, thus, is influenced by the cross-sectional area of the drain region. Therefore, the off-current is the same as that of the conventional single-channel MOSFET.

Further, with regard to the second channel region 38 formed above gate electrode 32, a channel may be formed on both sides as well as on the upper side of the gate electrode, as in the first embodiment. In this way, the on-current can be increased to an even greater extent.

Accordingly, as compared to the conventional single-channel MOSFET, in the present invention, the on-current is increased, but the off-current is the same. Thus, the on/off current ratio is greatly increased, thereby diminishing the power consumption of the cell. At the same time, the memory characteristics are improved.

Those skilled in the art will recognize that various modifications and variations can be applied to the present invention without departing from the scope or spirit thereof. Moreover, other embodiments of the invention will be apparent to those skilled in the art from consideration of the specification and practice of the invention disclosed herein. It is intended that the specification and examples be considered as exemplary only, with a true scope and spirit of the invention being indicated by the following claims.

What is claimed is:

1. A method of manufacturing a thin film transistor, the method comprising the steps of:
    forming a patterned layer on a substrate;
    forming a gate electrode which crosses the patterned layer;
    removing the patterned layer;
    forming a gate insulating film on a surface of the gate electrode including a lower portion of the gate electrode from which the patterned layer has been removed;
    forming an active layer which crosses the lower portion of the gate electrode from which the patterned layer has been removed and an upper portion of the gate electrode; and
    forming a first impurity region and a second impurity region at opposing sides of the gate electrode, wherein the first impurity region overlaps with a first sidewall of the gate electrode and the second impurity region is separated from a second sidewall of the gate electrode.

2. A method as claimed in claim 1, wherein the patterned layer and gate electrode are formed so that an etch rate of the patterned layer is different from that of the gate electrode.

3. A method as claimed in claim 1, wherein the gate electrode is formed of a polycrystalline silicon.

4. A method as claimed in claim 1, wherein the active layer is formed of a polycrystalline silicon.

5. A method as claimed in claim 4, wherein the polycrystalline silicon is a P-type polycrystalline silicon.

6. A method as claimed in claim 1, wherein the patterned layer is formed of a silicon nitride film.

7. A method as claimed in claim 1, further comprising the steps of:
    forming a patterned photoresist layer on the active layer corresponding to the upper portion of the gate electrode, and
    implanting ions in the active layer by using the patterned photoresist layer as a mask.

8. A method as claimed in claim 7, wherein the step of implanting ions includes a tilted ion implanting process.

9. A method as claimed in claim 1, wherein an offset region is formed on the active layer between the second impurity region and the second sidewall of the gate electrode.

\* \* \* \* \*